US012794488B2

(12) United States Patent
Javvaji et al.

(10) Patent No.: US 12,794,488 B2
(45) Date of Patent: Nov. 10, 2026

(54) # CONTINUOUS-TIME DELTA-SIGMA MODULATOR WITH CAPACITIVE FEED-INS

(71) Applicant: NXP B.V., Eindhoven (NL)

(72) Inventors: Sundeep Lakshmana Javvaji, Delft (NL); Muhammed Bolatkale, Delft (NL); Shagun Bajoria, Eindhoven (NL); Lucien Johannes Breems, Waalre (NL); Kofi Afolabi Anthony Makinwa, Delft (NL)

(73) Assignee: NXP B.V., Eindhoven (NL)

( * ) Notice: Subject to any disclaimer, the term of this patent is extended or adjusted under 35 U.S.C. 154(b) by 128 days.

(21) Appl. No.: 18/824,304

(22) Filed: Sep. 4, 2024

(65) Prior Publication Data

US 2026/0066918 A1 Mar. 5, 2026

(51) Int. Cl.
*H03M 3/00* (2006.01)

(52) U.S. Cl.
CPC .................................. *H03M 3/322* (2013.01)

(58) Field of Classification Search
CPC .................................................... H03M 3/322
See application file for complete search history.

(56) References Cited

U.S. PATENT DOCUMENTS 5,068,660 A * 11/1991 Swanson ............... H03M 3/376 341/172
5,079,550 A * 1/1992 Sooch ................... H03M 3/496 341/118
5,682,160 A * 10/1997 Ribner .................. H03M 3/374 341/143
5,757,300 A * 5/1998 Koilpillai ............. H03M 3/456 341/143
6,005,505 A * 12/1999 Linz ....................... H03K 23/68 341/143
6,765,520 B1 * 7/2004 Chuang ................. H03M 3/364 341/143
6,768,436 B1 * 7/2004 Chuang ................. H03M 3/364 341/143

(Continued)

OTHER PUBLICATIONS

Ali, Furrookh et al.; "Continuous-Time ΔΣ Modulators with Noise-Transfer-Function Enhancement"; Circuits and Systems, 2008; ISCAS 2008; IEEE International Symposium on Circuits and Systems, May 18-21, 2008, Seattle, Washington; DOI:10.1109/ISCAS.2008.4541696.

(Continued)

*Primary Examiner* — Lam T Mai

(57) ABSTRACT

In one or more embodiments, a continuous-time delta-sigma modulator (CTDSM) includes one or more integrators including one or more of a feed-forward loop or a feedback loop and including a one or more capacitive feed-ins to enable insertion of a signal at the outputs of the one or more integrators. The coefficients of one or more of the feed-forward loop, the feedback loop, or the capacitive feed-ins may be configured to shape a signal transfer function of the CTDSM. Additionally, the capacitive feed-ins remove signal components from the integrator outputs, reducing noise and reducing the power consumed by the CTDSM. In one or more embodiments, coefficients of the plurality of capacitive feed-ins may be selected to limit peaking in the signal transfer function (STF) of the CTDSM.

16 Claims, 5 Drawing Sheets

(56) References Cited

U.S. PATENT DOCUMENTS

| | | | | |
|---|---|---|---|---|
| 7,123,177 | B2 * | 10/2006 | Cheng | H03M 3/444 341/161 |
| 7,928,878 | B1 | 4/2011 | Coban et al. | |
| 8,502,719 | B2 * | 8/2013 | Ashburn, Jr. | H03M 3/368 341/143 |
| 8,552,894 | B2 * | 10/2013 | Huang | H03M 3/438 375/370 |
| 8,594,253 | B2 * | 11/2013 | Breems | H03D 7/00 375/346 |
| 8,643,524 | B1 * | 2/2014 | Zanbaghi | H03M 3/322 341/172 |
| 9,312,879 | B2 | 4/2016 | Hung et al. | |
| 9,559,719 | B1 * | 1/2017 | Kauffman | H03M 3/30 |
| 9,564,916 | B2 | 2/2017 | Bandyopadhyay | |
| 10,333,545 | B2 * | 6/2019 | Breems | H03M 3/368 |
| 10,425,100 | B1 * | 9/2019 | Vaturi | H03M 3/464 |
| 10,727,859 | B1 * | 7/2020 | Agrawal | H03M 3/37 |
| 10,763,888 | B1 * | 9/2020 | Zhang | H03M 3/352 |
| 11,394,395 | B1 * | 7/2022 | Zhang | H03M 3/424 |
| 11,451,240 | B2 * | 9/2022 | Tripathi | H03M 3/464 |
| 11,658,677 | B2 * | 5/2023 | Breems | H03M 3/34 341/143 |
| 12,015,426 | B2 * | 6/2024 | Breems | H03M 3/354 |
| 12,088,324 | B2 * | 9/2024 | Abdelaal | H03M 3/436 |
| 2003/0179121 | A1 * | 9/2003 | Gupta | H03M 3/454 341/143 |
| 2008/0272944 | A1 * | 11/2008 | Zhou | H03M 3/352 341/143 |
| 2013/0187803 | A1 | 7/2013 | Kaald | |
| 2016/0359499 | A1 * | 12/2016 | Bandyopadhyay | H03M 3/458 |
| 2018/0241409 | A1 * | 8/2018 | Dagher | H03M 3/396 |
| 2018/0343013 | A1 * | 11/2018 | Breems | H03M 3/496 |
| 2019/0348995 | A1 * | 11/2019 | Rajaee | H03M 3/422 |
| 2021/0126648 | A1 * | 4/2021 | Zhang | H03M 1/1061 |
| 2022/0239314 | A1 * | 7/2022 | Zhang | H03M 3/44 |
| 2022/0345150 | A1 * | 10/2022 | Modaffari | H03M 3/382 |
| 2022/0416809 | A1 * | 12/2022 | Zhang | H03M 3/404 |
| 2023/0283291 | A1 * | 9/2023 | Kim | H03M 3/338 341/143 |
| 2023/0314176 | A1 * | 10/2023 | Motz | G01D 5/145 324/207.2 |
| 2024/0106404 | A1 * | 3/2024 | Surendranath | H03F 1/26 |
| 2024/0275399 | A1 * | 8/2024 | Bandyopadhyay | H03M 3/368 |

OTHER PUBLICATIONS

Bolatkale, Muhammed et al.; "A 4 GHz Continuous-Time ΔΣ ADC With 70 dB DR and -74 dBFS THD in 125 MHz BW"; IEEE Journal of Solid-State Circuits ( vol. 46, Issue: 12, Dec. 2011), pp. 2857-2868; Date of Publication Sep. 29, 2011; DOI: 10.1109/JSSC.2011.2164963.

Bruckner, Timon et al.; "A GPU-Accelerated Web-Based Synthesis Tool for CT Sigma-Delta Modulators"; IEEE Transactions on Circuits and Systems I: Regular Papers (vol. 61, Issue: 5, May 2014) , pp. 1429-1441; Date of Publication Jan. 2, 2014; DOI: 10.1109/TCSI.2013.2289408.

Kim, Song-Bok et al.; "A 2.7 mW, 90.3 dB DR Continuous-Time Quadrature Bandpass Sigma-Delta Modulator for GSM/EDGE Low-IF Receiver in 0.25 μm CMOS"; IEEE Journal of Solid-State Circuits ( vol. 44, Issue: 3, Mar. 2009) pp. 891-900; Date of Publication Feb. 24, 2009; DOI: 10.1109/JSSC.2008.2012367.

Lin, Chen-Chien et al.; "A Low-Power Dual-Mode Continuous-Time Delta-Sigma Modulator with a Folded Quantizer"; 2013 International Symposium onVLSI Design, Automation, and Test (VLSI-DAT), Apr. 22-24, 2013, Hsinchu, Taiwan; DOI: 10.1109/VLDI-DAT.2013.6533839.

Schimper, Markus et al.; "A 3mW Continuous-Time CA-Modulator for EDGE/GSM with High Adjacent Channel Tolerance"; Proceeding of the 30th European Solid-State Circuits Conference (ESSCIRC 2004), Sep. 21-23, 2004, Leuven, Belgium; DOI:10.1109/ESSCIR.2004.1356648.

* cited by examiner

200

500

CONTINUOUS-TIME DELTA-SIGMA MODULATOR WITH CAPACITIVE FEED-INS

FIELD OF USE

The present disclosure generally relates to delta-sigma modulators, and more particularly to continuous-time delta-sigma modulators with capacitive feed-ins for signal transfer function correction.

BACKGROUND

Continuous-time delta-sigma modulators (CTDSMs) are widely used to achieve the high linearity requirements (<−100 decibels relative to full-scale) intended for high quality radio and car radar applications. Such CTDSMs often include cascade of integrators with feed-forward (CIFF) loop filters to remove the signal component from the integrator outputs to achieve this desired linearity. To realize bandwidths of a few tens of megahertz to hundreds of megahertz, the CTDSM may utilize gigahertz sampling frequencies with more than one clock cycle excess loop delay (ELD) for the quantization. CIFF loop filter with ELD compensation results in a significant peaking in the Signal Transfer Function (STF).

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures and in the detailed description indicates similar or identical items or features.

While implementations are described in this disclosure by way of example, those skilled in the art will recognize that the implementations are not limited to the examples or figures described. Rather, the figures and detailed description thereto are not intended to limit implementations to the form disclosed, but instead the intention is to cover all modifications, equivalents, and alternatives falling within the spirit and scope as defined by the appended claims. The headings used in this disclosure are for organizational purposes only and are not meant to limit the scope of the description or the claims. As used throughout this application, the word "may" is used in a permissive sense (in other words, the term "may" is intended to mean "having the potential to") instead of in a mandatory sense (as in "must"). Similarly, the terms "include," "including," and "includes" mean "including, but not limited to."

DETAILED DESCRIPTION

Embodiments of circuits and methods are described below that include a CTDSM with capacitive feed-ins to the integrator inputs to shape the signal transfer function and to reduce peaking. While such feed-ins can be implemented as resistive feed-ins by putting resistors at the inputs of the integrators, such implementations may introduce a significant input signal component at the integrator outputs, degrading the linearity and requiring additional power consumption by the amplifiers to overcome the linearity degradation introduced by the input signal component.

Embodiments of a CTDSM are described below that may be implemented as a CTDSM of any order and with one or more capacitive feed-ins configured to shape the signal transfer function, prevent introduction of the input signal components to the output of the integrators, and reduce peaking in the signal transfer function. Such peaking is a problem in wireless applications as out-of-band interferers can saturate the CTDSM. In one or more embodiments, the capacitive feed-in coefficients may be configured to improve the out-of-band gain and to shape the signal transfer function of the CTDSM.

Figure 1:
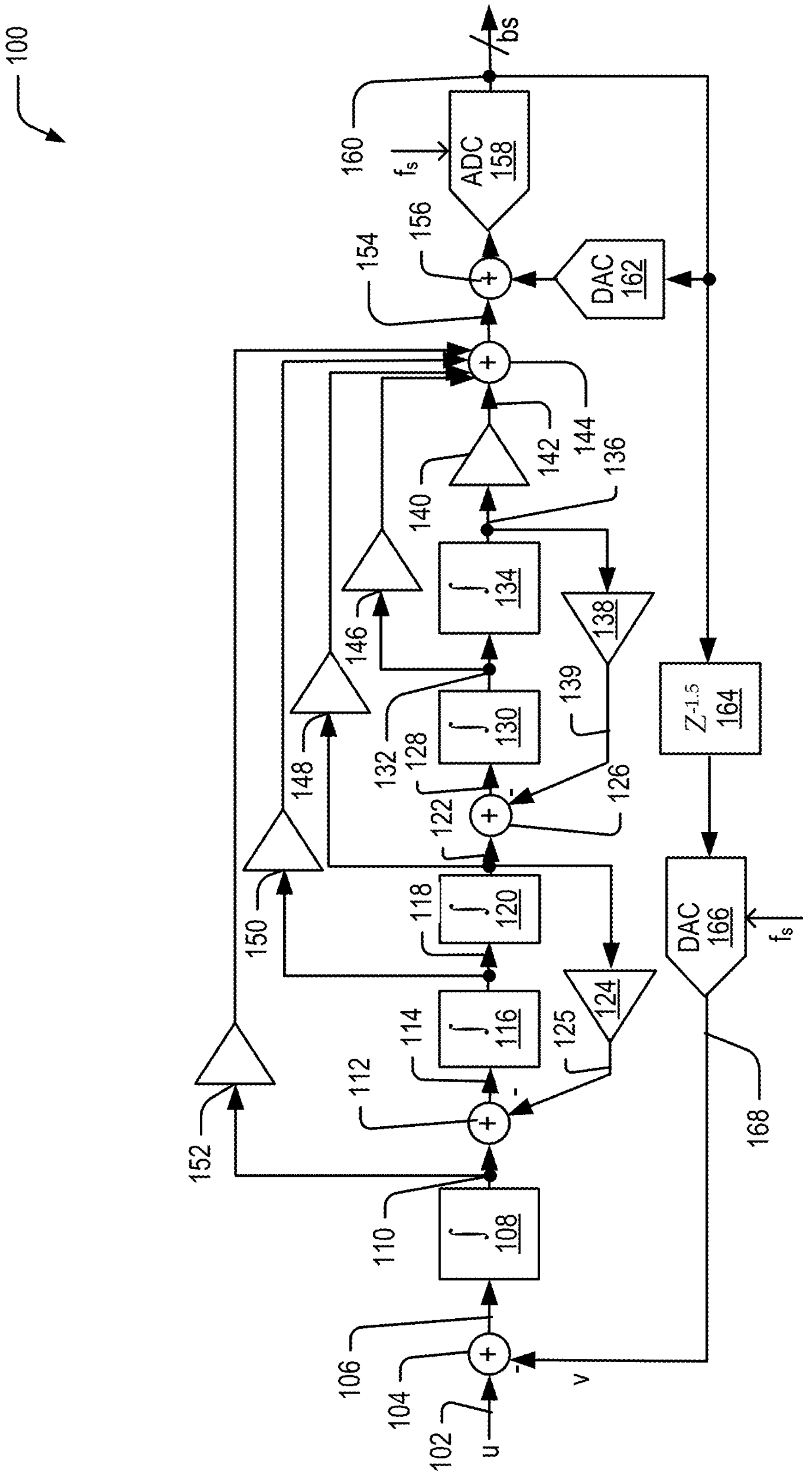
FIG. 1 depicts a block diagram of an embodiment of a fifth-order continuous-time delta-sigma modulator (CTDSM) with a cascade of integrators with feed-forward (CIFF) loop filter and without feed-ins.

FIG. 1 depicts a block diagram of an embodiment of a fifth-order continuous-time delta-sigma modulator (CTDSM) 100 with a cascade of integrators 108, 116, 120, 130, and 134 with a feed-forward (CIFF) loop filter. It should be appreciated that the CTDSM 100 is presented for illustrative purposes only and that the methodologies and structures described herein may be applied to CTDSMs of any order to improve the out-of-band gain and to shape the signal transfer function of the CTDSM. The CTDSM 100 may include an input 102 to receive a signal u. The input 102 may be coupled to a first input of a summing node 104, which may include a second input coupled to a node 168 to receive feedback, and an output coupled to a node 106.

The CTDSM 100 may include a first integrator 108 including an input coupled to the node 106 and an output coupled to a node 110. The CTDSM 100 may include a summing node 112 including a first input coupled to the node 112, a second input coupled to a node 125, and an output coupled to a node 114. The CTDSM 100 may include a second integrator 116 including an input coupled to the node 114 and an output coupled to a node 118. The CTDSM 100 may include a third integrator 120 including an input coupled to the node 118 and an output coupled to a node 122. A feedback component 124 may include an input coupled to the node 122 and an output coupled to the node 125, which is coupled to the second input of the summing node 112.

The CTDSM 100 may include a summing node 126 including a first input coupled to the node 122, a second input coupled to a node 139, and an output coupled to a node 128. The CTDSM 100 may include a fourth integrator 130 including an input coupled to the node 128 and an output coupled to a node 132. The CTDSM 100 may include a fifth integrator 134 including an input coupled to the node 132 and an output coupled to a node 136. A feedback component 138 may include an input coupled to the node 136 and an output coupled to the node 139, which may be coupled to the second input of the summing node 126.

The CTDSM 100 may include a plurality of feed-forward components 140, 146, 148, 150, and 152. The feed-forward component 140 may include an input coupled to the node 136 and an output coupled to a node 142, which may be coupled to a first input of a summing node 144. The feed-forward component 146 may include an input coupled to the node 132 and an output coupled to a second input of the summing node 144. The feed-forward component 148 may include an input coupled to the node 122 and an output coupled to a third input of the summing node 144. The feed-forward component 150 may include an input coupled to the node 118 and an output coupled to a fourth input of the summing node 144. The feed-forward component 152 may include an input coupled to the node 110 and an output coupled to a fifth input of the summing node 144. The summing node 144 may include an output coupled to a node 154.

The CTDSM 100 may include a summing node 156 including an input coupled to the node 154, a second input, and an output coupled to an input of an analog-to-digital converter (ADC) 158. The ADC 158 may include a second input configured to receive a sampling frequency signal $f_s$ and an output coupled to a node 160 to provide a digital output signal.

The CTDSM 100 may include a digital-to-analog converter (DAC) 162 including an input coupled to the node 160 and an output coupled to the second input of the summing node 156 to account for excess loop delay for delays due to quantization. The CTDSM 100 may also include a transfer function 164 including an input coupled to the node 160 and an output coupled to an input of a DAC 166. The DAC 166 may include a second input to receive the sampling frequency signal $f_s$ and may include an output coupled to the second input of the summing node 104.

The feed-forward components 152, 150, 148, 146, and 140 may introduce feed-forward coefficients C1, C2, C3, C4, and C5, respectively. In one or more embodiments, the unity gain frequencies of the integrators 108, 112, 122, 126, and 132 are ω1, ω2, ω3, ω4, and ω5, respectively. To optimize the in-band quantization noise, the loop filter may include two resonators. The first resonator may include integrators 116 and 120 and feedback component 124, which is realized using a coefficient d1. The second resonator may include integrators 130 and 134 and feedback component 138, which may be realized using the coefficient d2. The feedback coefficients d1 and d2 for the feedback components 124 and 138 may be determined based on a selected frequency response for each of the resonators.

In one or more embodiments, the CTDSM 100 is a fifth-order modulator designed for a bandwidth of 120 MHz with an over-sampling ratio (OSR) of 19 and a 1.5 clock cycle excess loop delay, which results in a sampling frequency of 4.56 gigahertz (GHz). In this embodiment, the CTDSM 100 does not include feed-ins. An example plot of the signal transfer function of the CTDSM 100 and of the CTDSM with feed-ins of FIG. 3 is shown in FIG. 2.

Figure 2:
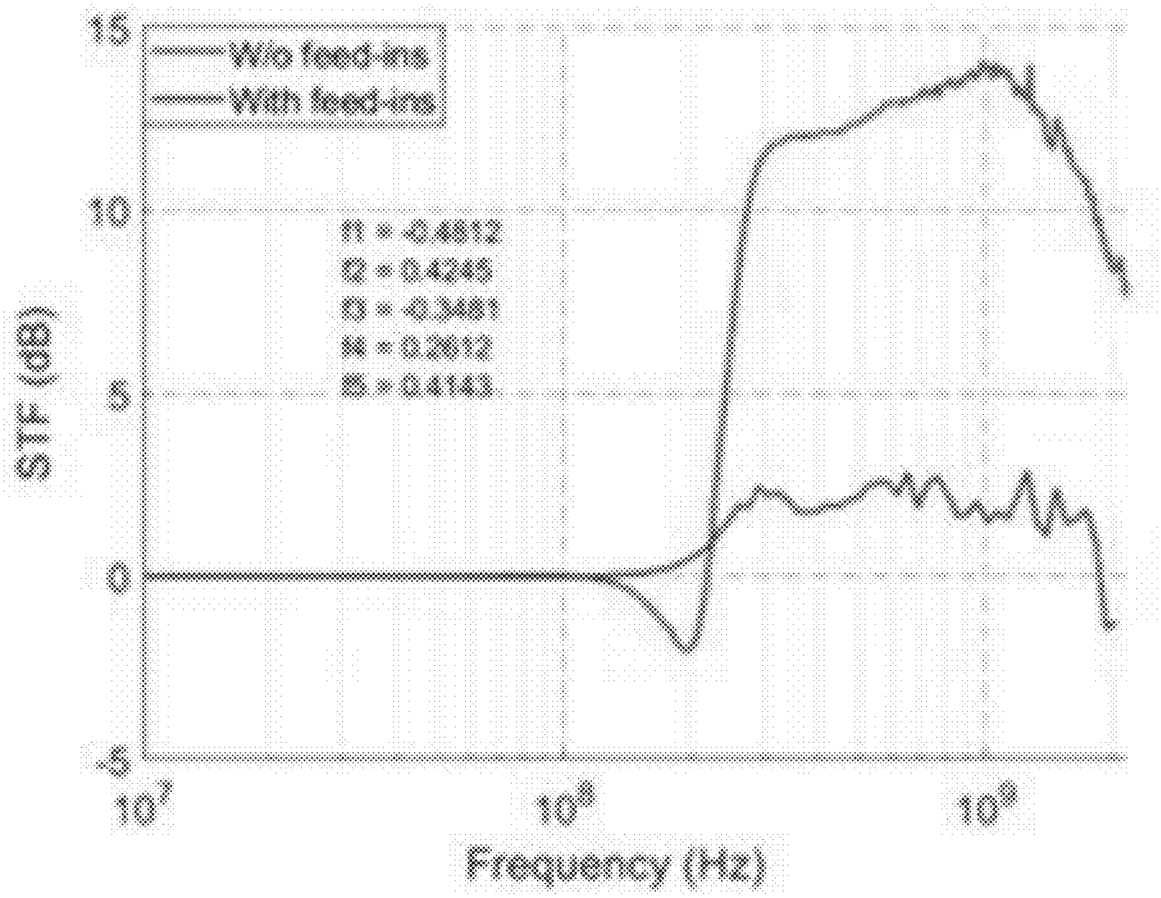
FIG. 2 depicts a graph of the signal transfer function versus frequency for the CTDSM of FIG. 1 without and with feed-ins.
Figure 3:
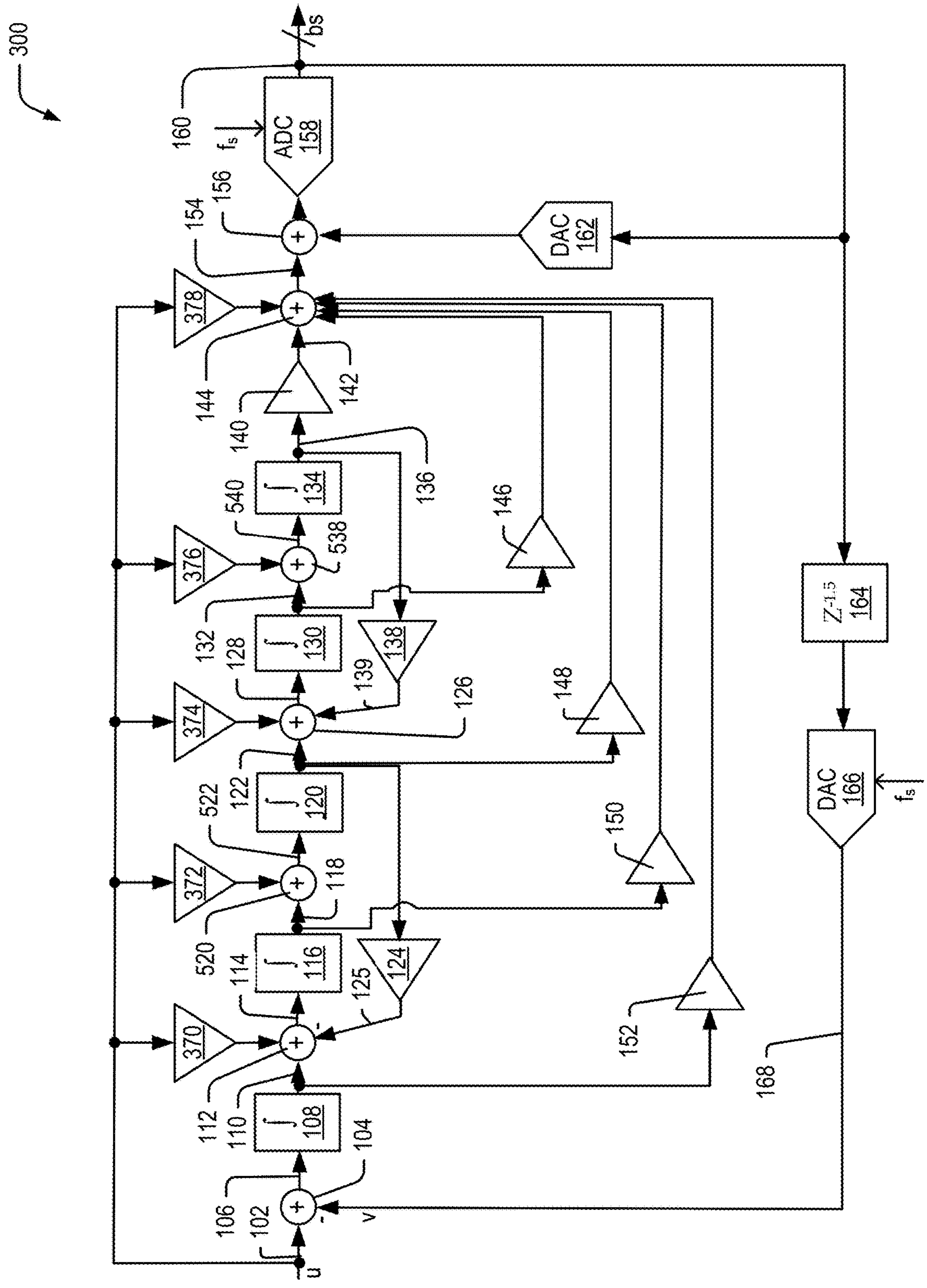
FIG. 3 depicts a block diagram of an embodiment of a fifth-order CTDSM with a CIFF loop filter and with feed-ins, in accordance with certain embodiments.

FIG. 2 depicts a graph 200 of the signal transfer function versus frequency for the CTDSM 100 of FIG. 1 without feed-ins and of the CTDSM of FIG. 3 with feed-ins. With respect to the CTDSM 100, in the signal band that is less than 120 MHz, the magnitude of signal transfer function is 1 (0 dB). At frequencies above 120 MHz, the CTDSM 100 demonstrates significant out-of-band peaking of more than 13 dB. This signal peaking may be problematic because the out-of-band signals may saturate the CTDSM 100.

In contrast, the CTDSM described below with respect to FIG. 3 includes capacitive feed-ins, which may be used to shape the signal transfer function and to reduce peaking. An example of the CTDSM 100 with capacitive feed-ins is described below with respect to FIG. 3.

FIG. 3 depicts a block diagram of an embodiment of a fifth-order CTDSM 300 with a CIFF loop filter and with feed-ins 370, 372, 374, 376, and 378, in accordance with certain embodiments. The CTDSM 300 includes all the elements of the CTDSM 100 of FIG. 1 and includes the feed-ins 370, 372, 374, 376, and 378, additional summing elements 520 and 538, and additional nodes 522 and 540.

The CTDSM 300 may include the input 102 to receive a signal u. The input 102 may be coupled to a first input of a summing node 104, which may include a second input coupled to a node 168 to receive feedback, and an output coupled to a node 106.

The CTDSM 300 may include a first integrator 108 including an input coupled to the node 106 and an output coupled to a node 110. The CTDSM 300 may include a summing node 112 including a first input coupled to the node 112, a second input coupled to a node 125, a third input to receive a feed-in signal, and an output coupled to a node 114. The CTDSM 300 may include a second integrator 116 including an input coupled to the node 114 and an output coupled to a node 118. The CTDSM 300 may include a summing node 520 including a first input coupled to the node 118, a second input to receive a feed-in signal, and an output coupled to a node 522.

The CTDSM 300 may include a third integrator 120 including an input coupled to the node 522 and an output coupled to a node 122. A feedback component 124 may include an input coupled to the node 122 and an output coupled to the node 125, which is coupled to the second input of the summing node 112.

The CTDSM 300 may include a summing node 126 including a first input coupled to the node 122, a second input coupled to a node 139, a third input to receive a feed-in signal, and an output coupled to a node 128. The CTDSM 300 may include a fourth integrator 130 including an input coupled to the node 128 and an output coupled to a node 132. The CTDSM 300 may include a summing node 538 including an input coupled to the node 132, a second input to receive a feed-in signal, and an output coupled to a node 540.

The CTDSM 300 may include a fifth integrator 134 including an input coupled to the node 540 and an output coupled to a node 136. A feedback component 138 may include an input coupled to the node 136 and an output coupled to the node 139, which may be coupled to the second input of the summing node 126.

The CTDSM 300 may include a plurality of feed-forward components 140, 146, 148, 150, and 152. The feed-forward component 140 may include an input coupled to the node 136 and an output coupled to a node 142, which may be coupled to a first input of a summing node 144. The feed-forward component 146 may include an input coupled to the node 132 and an output coupled to a second input of the summing node 144. The feed-forward component 148 may include an input coupled to the node 122 and an output coupled to a third input of the summing node 144. The feed-forward component 150 may include an input coupled to the node 118 and an output coupled to a fourth input of the summing node 144. The feed-forward component 152 may include an input coupled to the node 110 and an output coupled to a fifth input of the summing node 144. The summing node 144 may include a sixth input to receive a feed-in signal and may include an output coupled to a node 154.

The CTDSM 300 may include a summing node 156 including an input coupled to the node 154, a second input, and an output coupled to an input of an analog-to-digital converter (ADC) 158. The ADC 158 may include a second input configured to receive a sampling frequency signal $f_s$ and an output coupled to a node 160 to provide a digital output signal.

The CTDSM 300 may include a digital-to-analog converter (DAC) 162 including an input coupled to the node 160 and an output coupled to the second input of the summing node 156 to account for excess loop delay for delays due to quantization. The CTDSM 300 may also include a transfer function 164 including an input coupled to the node 160 and an output coupled to an input of a DAC 166. The DAC 166 may include a second input to receive the sampling frequency signal $f_s$ and may include an output coupled to the second input of the summing node 104.

The CTDSM 300 may include a first feed-in 370, a second feed-in 372, a third feed-in 374, a fourth feed-in 376, and a fifth feed-in 378, each of which may include an input coupled to the input 102 and each of which may include an output. The output of the first feed-in 370 may be coupled to the second input of the summing node 112. The output of the second feed-in 372 may be coupled to the summing node 520. The output of the third feed-in 374 may be coupled to the summing node 126. The output of the fourth feed-in 376 may be coupled to the summing node 538. The output of the fifth feed-in 376 may be coupled to the summing node 144.

In one or more embodiments, each of the feed-ins 370, 372, 374, 376, and 378 may be capacitive and may be configured to capacitively couple a signal to the inputs of the integrators. In one or more embodiments, the coefficients of the feed-ins 370, 372, 374, 376, and 378 may be selected to shape the signal transfer function. In one or more embodiments, the coefficients may be selected to achieve a maximum out-of-band gain of approximately 3 dB, which can be reduced further by selecting the circuit components to provide a desired frequency response.

Figure 4A:
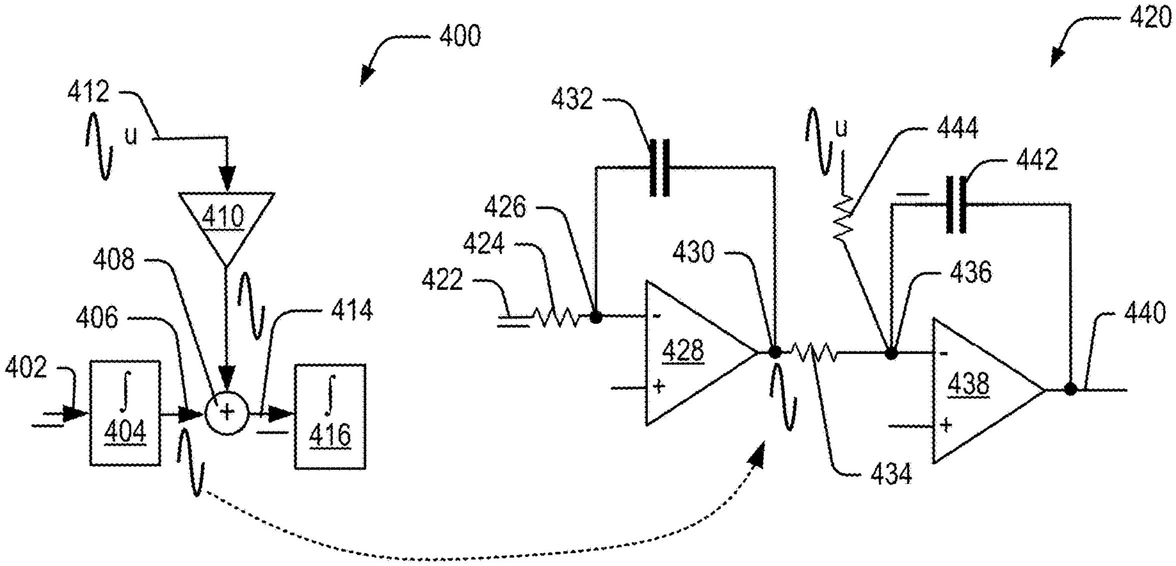
FIG. 4A (Related Art)
FIG. 4A depicts an embodiment of a resistive feed-in, which results in a large signal component at the output of the integrators.

FIG. 4A depicts an embodiment of a circuit 400 including a resistive feed-in 410, which results in a large signal component at the output of the integrators. In this example, the circuit 400 may include a first integrator 404 including an input 402 and an output coupled to a node 406, which may be coupled to a first input of a summing node 408. The summing node 408 may include a second input coupled to an output of a resistive feed-in 410, which may have an input coupled to a node 412 to receive an input signal u. The summing node 408 may include an output coupled to a node 414, which may be coupled to an input of an integrator 416.

In this example, the input signal u may introduce a significant signal component at the output of the integrator 404 (i.e., at the node 406), which can be further understood by reviewing the circuit 420. The circuit 420 may include an input 422. The circuit 420 may include a resistor 424 including a first terminal coupled to the input 422 and a second terminal coupled to a node 426. The circuit 420 may include an inverting amplifier 428 including a negative input coupled to the node 426, and positive input, and an output coupled to a node 430. A capacitor 432 may include a first terminal coupled to the node 426 and a second terminal coupled to the node 430.

The circuit 420 may include a resistor 434 including a first terminal coupled to the node 430 and a second terminal coupled to a node 436. The circuit 420 may include an inverting amplifier including a negative input coupled to the node 436, a positive input, and an output coupled to a node 440. A capacitor 442 may include a first terminal coupled to the node 436 and a second terminal coupled to the node 440. The resistive feed-in may be represented by a resistor 444 including a first terminal to receive a feed-in signal and a second terminal coupled to the node 436.

When the feed-in signal u is applied to the first terminal of the resistor 444, a significant signal component may appear at the output of the integrator (amplifier 428 and capacitor 432). The signal component f1 may be a function of the ratio of the resistor 434 to the resistor 444

$$\left(\text{i.e., } f_1 = \frac{R_{434}}{R_{444}}\right).$$

This large input component may demand a relatively high DC gain (greater than sixty decibels) to achieve high linearity (less than a negative one hundred decibels relative to full scale (dBFS), which may cause greater power consumption.

Figure 4B:
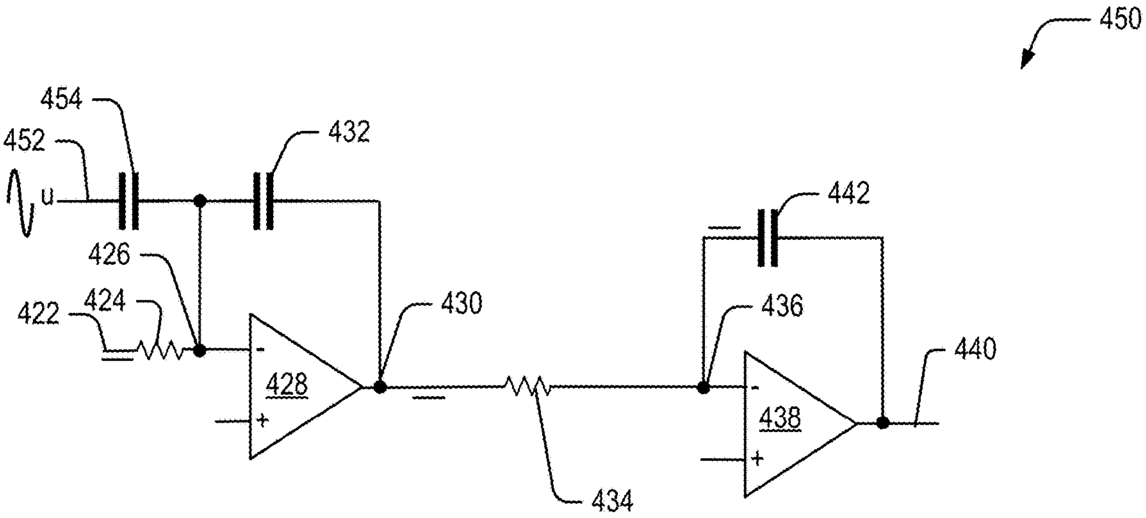
FIG. 4B depicts an embodiment of a capacitive feed-in, which removes the signal component from the integrator outputs, in accordance with certain embodiments.

FIG. 4B depicts an embodiment of circuit 450 with capacitive feed-ins, which removes the signal component from the integrator outputs, in accordance with certain embodiments. In the illustrated embodiment, the circuit 450 may include an input 422. The circuit 450 may include a resistor 424 including a first terminal coupled to the input 422 and a second terminal coupled to a node 426. The circuit 450 may include an inverting amplifier 428 including a negative input coupled to the node 426, and positive input, and an output coupled to a node 430. A capacitor 432 may include a first terminal coupled to the node 426 and a second terminal coupled to the node 430.

The circuit 450 may include a resistor 434 including a first terminal coupled to the node 430 and a second terminal coupled to a node 436. The circuit 450 may include an inverting amplifier including a negative input coupled to the node 436, a positive input, and an output coupled to a node 440. A capacitor 442 may include a first terminal coupled to the node 436 and a second terminal coupled to the node 440. The capacitive feed-in may be represented by a capacitor 454 including a first terminal coupled to an input 452 and including a second terminal coupled to the node 426. In this embodiment, the signal component f1 may be determined a ratio of the capacitor 454 to the capacitor 432

$$\left(\text{i.e., } f_1 = \frac{c_{454}}{c_{432}}\right).$$

The capacitive feed-in provided by the capacitor 454 may realize the same transfer function as the resistive feed-in 410 in FIG. 4, except that the capacitors 454 and 432 remove the signal component from the integrator outputs. The amplifiers of the circuit 450 may be realized with a much lower direct current (DC) gain for the same linearity as the circuit 420 in FIG. 4A.

Figure 5:
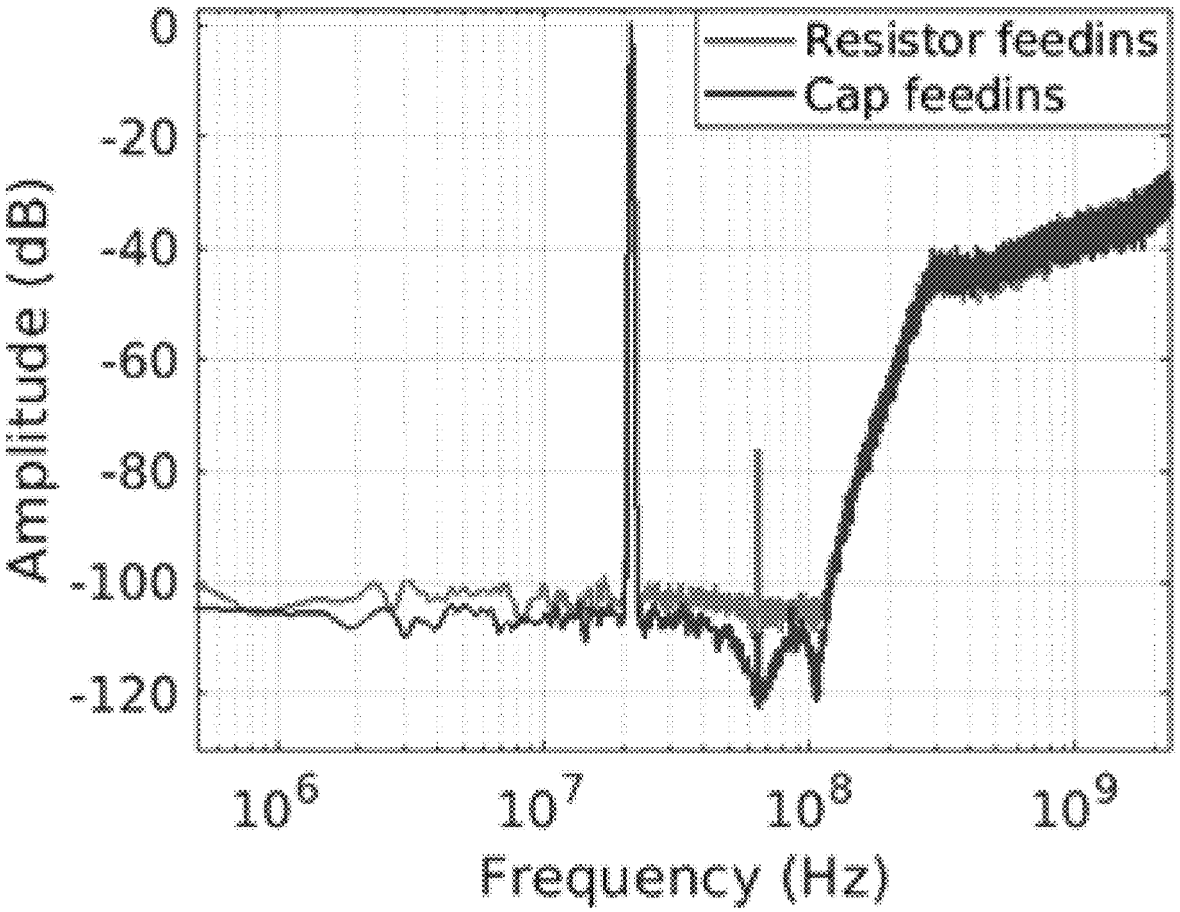
FIG. 5 depicts a graph of the output spectrum of amplitude versus frequency for the CTDSM with resistive feed-ins and for the CTDSM with capacitive feed-ins.

FIG. 5 depicts a graph 500 of the output spectrum of amplitude versus frequency for the CTDSM 300 with resistive feed-ins and with capacitive feed-ins. In this example, the first integrator of the CTDSM 300 is implemented using an amplifier with a limited DC gain (approximately 30 dB). The capacitive feed-ins may result in an improvement in the total harmonic distortion of more than 25 dB over resistive feed-ins.

In one or more embodiments, a CTDSM 300 may include a plurality of capacitive feed-ins having coefficients selected to provide a desired signal transfer function. The capacitive feed-ins remove signal components from the outputs of the integrators, enabling lower power consumption because the CTDSM 300 may be realized with a lower DC gain as compared to a similar circuit with resistive feed-ins. Thus, the CTDSM 300 may demonstrate reduced power consumption and reduced signal noise.

In one or more embodiments, the capacitive feed-in circuitry may introduce a parallel combination of a resistor and a capacitor for each feed-in. Unlike conventional CTDSM configurations which have a resistive input impedance, the input impedance of the CTDSM 300 an impedance that reflects the parallel capacitor-resistor configuration.

In conjunction with the systems, methods, and circuits described above with respect to FIGS. 1-5, a fifth-order CTDSM 300 including a CIFF loop filter may include a plurality of capacitive feed-ins to enable insertion of a signal at the outputs of the integrators. The coefficients of the capacitive feed-ins may be configured to shape the signal transfer function. Additionally, the capacitive feed-ins remove signal components from the integrator outputs, reducing noise and reducing the power consumed by the CTDSM 300.

The systems, methods, and circuits described herein may be further understood in view of the examples presented below.

Example 1: A circuit may include a continuous-time delta-sigma modulator (CTDSM) including one or more integrators and including one or more of a feed-forward loop or a feedback loop; and one or more capacitive feed-ins, each capacitive feed-in coupled to an output of one of the one or more integrators to shape a signal transfer function of the CTDSM.

Example 2: The circuit of Example 1, where coefficients of the of the one or more capacitive feed-ins are selected to modify the signal transfer function of the CTDSM.

Example 3: The circuit of any of Examples 1 or 2, where one or more integrators are coupled in series; and each of the one or more capacitive feed-ins includes a capacitor coupled between an input terminal and one of the one or more integrators.

Example 4: The circuit of any of Examples 1-3, where the one or more capacitive feed-ins are configured to receive a signal and to provide the signal to the one or more integrators; and to prevent signal components from the received signal from reaching outputs of the one or more integrators.

Example 5: The circuit of any of Examples 1-4, where each integrator of the cascade of integrators may include an inverting amplifier including a negative input coupled to a first node to receive a signal, a positive input, and an output coupled to a second node to provide an inverted output signal; and a feedback capacitor including a first terminal coupled to the first node and a second terminal coupled to the second node.

Example 6: The circuit of Example 5, where each capacitive feed-in of the one or more capacitive feed-ins comprises a feed-in capacitor including a first terminal to receive a feed-in signal and including a second terminal coupled to the first terminal of the feedback capacitor.

Example 7: The circuit of Example 6, where a signal component of the feed-in signal at the second node determined by a ratio of a feed-in capacitance of the feed-in capacitor to a feedback capacitance of the feedback capacitor.

Example 8: The circuit of any of Examples 1-7, where the CTDSM may include an integrator including an integrator input and an integrator output; a first resonator including a first resonator input coupled to the integrator output and including a first resonator output; and a second resonator including a second resonator input coupled to the first resonator output and including a second resonator output; and where the one or more capacitive feed-ins may include a first capacitor including a first terminal coupled to an input terminal and including a second terminal coupled to an input of the integrator; a second capacitor including a first terminal coupled to the input terminal and including a second terminal coupled to the first resonator input of the first resonator; and a third capacitor including a first terminal coupled to the input terminal and including a second terminal coupled to the input of the second resonator input of the second resonator.

Example 9: A method may include providing a circuit including a continuous-time delta-sigma modulator (CTDSM) including one or more integrators including one or more of a feed-forward loop or a feedback loop and including a one or more capacitive feed-ins, each capacitive feed-in coupled to one of the one or more integrators; determining coefficients for one or more of the feed-forward loop, the feedback loop or the one or more capacitive feed-ins to produce a selected signal transfer function; and synthesizing the circuit with the determined coefficients to produce the CTDSM with a selected signal transfer function.

Example 10: The method of Example 9, where the CTDSM comprises one or more of a Butterworth filter, a Chebyshev filter, or an inverse Chebyshev filter.

Example 11: The method of any of Examples 9 or 10, where determining the coefficients may include selecting the coefficients to provide a selected signal transfer function (STF) for the CTDSM.

Example 12: A circuit may include a continuous-time delta-sigma modulator (CTDSM) including a one or more integrators and including one or more of a feed-forward loop or a feedback loop; and one or more capacitive feed-ins, each capacitive feed-in coupled to an output of one of the one or more integrators; and where first coefficients of the one or more of the feed-forward loop or the feedback loop and second coefficients of the one or more capacitive feed-ins are selected to provide a selected signal transfer function for the CTDSM.

Example 13: The circuit of Example 12, where the CTDSM comprises a fifth-order CTDSM.

Example 14: The circuit of any of Examples 12 or 13, where the first coefficients and the second coefficients are selected to limit peaking in the signal transfer function.

Example 15: The circuit of any of Examples 12-14, where the one or more integrators are arranged in series; and each of the one or more feed-in capacitors is coupled between an input terminal and one of the one or more integrators.

Example 16: The circuit of any of Examples 12-15, wherein the one or more capacitive feed-ins are configured to receive a signal and to provide the signal to the one or more integrators; and to prevent signal components from the received signal from reaching outputs of the one or more integrators.

Example 17: The circuit of any of Examples 12-16, where each integrator of the one or more integrators may include an inverting amplifier including a negative input coupled to a first node to receive a signal, a positive input, and an output coupled to a second node to provide an inverted output signal; and a feedback capacitor including a first terminal coupled to the first node and a second terminal coupled to the second node.

Example 18: The circuit of Example 17, where each capacitive feed-in of the one or more capacitive feed-ins comprises a feed-in capacitor including a first terminal to receive a feed-in signal and including a second terminal coupled to the first terminal of the feedback capacitor.

Example 19: The circuit of Example 18, where a signal component of the feed-in signal at the second node is determined by a ratio of a feed-in capacitance of the feed-in capacitor to a feedback capacitance of the feedback capacitor.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims.

What is claimed is:

1. A circuit comprises:

a continuous-time delta-sigma modulator (CTDSM) including one or more integrators and including one or more of a feed-forward loop or a feed-back loop and excess loop delay compensation; and a plurality of capacitive feed-ins, each capacitive feed-in coupled to an output of one of the integrators of the cascade of integrators to shape a signal transfer function of the CTDSM; and wherein each integrator of the one or more integrators comprises:

an inverting amplifier including a negative input coupled to a first node to receive a signal, a positive input, and an output coupled to a second node to provide an inverted output signal; and a feedback capacitor including a first terminal coupled to the first node and a second terminal coupled to the second node; and wherein each capacitive feed-in of the one or more capacitive feed-ins comprises a feed-in capacitor including a first terminal to receive a feed-in signal and including a second terminal coupled to the first terminal of the feedback capacitor.

2. The circuit of claim 1, wherein coefficients of the plurality of capacitive feed-ins are selected to modify the signal transfer function (STF) of the modulator.

3. The circuit of claim 1, wherein:

the one or more integrators are coupled in series; and each of the one or more capacitive feed-ins includes a capacitor coupled between an input terminal and one of the one or more integrators.

4. The circuit of claim 1, wherein the one or more capacitive feed-ins are configured to:

receive a signal and to provide the signal to the one or more integrators; and prevent signal components from the received signal from reaching outputs of the one or more integrators.

5. The circuit of claim 1, wherein a signal component of the feed-in signal at the second node determined by a ratio of a feed-in capacitance of the feed-in capacitor to a feedback capacitance of the feedback capacitor.

6. The circuit of claim 1, wherein the CTDSM comprises:

an integrator including an integrator input and an integrator output;

a first resonator including a first resonator input coupled to the integrator output and including a first resonator output; and a second resonator including a second resonator input coupled to the first resonator output and including a second resonator output; and wherein the one or more capacitive feed-ins comprises:

a first capacitor including a first terminal coupled to an input terminal and including a second terminal coupled to an input of the integrator;

a second capacitor including a first terminal coupled to the input terminal and including a second terminal coupled to the first resonator input of the first resonator; and a third capacitor including a first terminal coupled to the input terminal and including a second terminal coupled to the input of the second resonator input of the second resonator.

7. A method comprising:

providing a circuit including a continuous-time delta-sigma modulator (CTDSM) including one or more integrators and including one or more of a feed-forward loop or a feedback loop and including one or more capacitive feed-ins, each capacitive feed-in coupled to one of the one or more integrators;

determining coefficients for one or more of the feed-forward loop, the feedback loop, or the one or more capacitive feed-ins to produce a selected signal transfer function; and synthesizing the circuit with the determined coefficients to produce the CTDSM with a selected signal transfer function; and wherein first coefficients of the feed-forward loop and second coefficients of the one or more capacitive feed-ins are selected to limit peaking in the selected signal transfer function.

8. The method of claim 7, wherein the feed-forward loop includes a loop filter comprising one or more of a Butterworth filter, a Chebyshev filter, or an inverse Chebyshev filter.

9. The method of claim 7, wherein determining the coefficients may include selecting the coefficients to provide a selected signal transfer function (STF) for the CTDSM.

10. A circuit comprising:

a continuous-time delta-sigma modulator (CTDSM) including a one or more integrators and including one or more of a feed-forward loop or a feedback loop; and a one or more capacitive feed-ins, each capacitive feed-in coupled to an output of one of the one or more integrators; and wherein first coefficients of the one or more of the feed-forward loop or the feedback loop and second coefficients of the one or more capacitive feed-ins are selected to provide a selected signal transfer function for the CTDSM; and wherein the first coefficients and the second coefficients are selected to limit peaking in the signal transfer function.

11. The circuit of claim 10, wherein the CTDSM comprises a fifth-order CTDSM.

12. The circuit of claim 10, wherein:

the one or more integrators are arranged in series; and each of the one or more capacitive feed-ins includes a capacitor coupled between an input terminal and one of the one or more integrators.

13. The circuit of claim 10, wherein the one or more capacitive feed-ins is configured to:

receive a signal and to provide the signal to the one or more integrators; and prevent signal components from the received signal from reaching outputs of the one or more integrators.

14. The circuit of claim 10, wherein each integrator of the one or more integrators comprises:

an inverting amplifier including a negative input coupled to a first node to receive a signal, a positive input, and an output coupled to a second node to provide an inverted output signal; and a feedback capacitor including a first terminal coupled to the first node and a second terminal coupled to the second node.

15. The circuit of claim 14, wherein each capacitive feed-in of the one or more capacitive feed-ins comprises a feed-in capacitor including a first terminal to receive a feed-in signal and including a second terminal coupled to the first terminal of the feedback capacitor.

16. The circuit of claim 15, wherein a signal component of the feed-in signal at the second node is determined by a ratio of a feed-in capacitance of the feed-in capacitor to a feedback capacitance of the feedback capacitor.

* * * * *